United States Patent
Yoshioka et al.

(10) Patent No.: US 8,170,425 B2
(45) Date of Patent: May 1, 2012

(54) OPTICAL SIGNAL RECEIVING CIRCUIT

(75) Inventors: Hiroyuki Yoshioka, Akishima (JP);
Ryuichi Satomura, Tsurugashima (JP);
Hideyuki Takahashi, Hachioji (JP);
Hidefumi Yoshida, Ome (JP)

(73) Assignee: Hitachi, Ltd., Tokyo (JP)

( * ) Notice: Subject to any disclaimer, the term of this patent is extended or adjusted under 35 U.S.C. 154(b) by 605 days.

(21) Appl. No.: 12/350,612

(22) Filed: Jan. 8, 2009

(65) Prior Publication Data
US 2009/0238581 A1   Sep. 24, 2009

(30) Foreign Application Priority Data

Mar. 24, 2008   (JP) ................ 2008-074848

(51) Int. Cl.
*H04B 10/06* (2006.01)
(52) U.S. Cl. ............ 398/209; 398/208; 398/210
(58) Field of Classification Search .......... None
See application file for complete search history.

(56) References Cited

U.S. PATENT DOCUMENTS

| | | | |
|---|---|---|---|
| 5,812,030 A | | 9/1998 | Inami et al. |
| 5,952,883 A | * | 9/1999 | Masuta ............ 330/279 |
| 6,097,755 A | * | 8/2000 | Guenther et al. ...... 375/228 |
| 6,404,282 B2 | * | 6/2002 | Kikuchi et al. ........... 330/86 |
| 2002/0017951 A1 | | 2/2002 | Kikuchi et al. |
| 2003/0197563 A1 | | 10/2003 | Nishizono |
| 2004/0124917 A1 | | 7/2004 | Takagi |
| 2006/0202761 A1 | | 9/2006 | Miyamoto et al. |
| 2007/0024370 A1 | * | 2/2007 | Hirata et al. ............ 330/285 |
| 2007/0212081 A1 | | 9/2007 | Takahashi et al. |
| 2008/0309407 A1 | | 12/2008 | Nakamura et al. |

FOREIGN PATENT DOCUMENTS

| | | |
|---|---|---|
| JP | 02-278906 | 11/1990 |
| JP | H09-008563 A | 1/1997 |
| JP | 11-266126 | 9/1999 |
| JP | 2001-320253 | 11/2001 |
| JP | 2003-258580 A | 9/2003 |
| JP | 2003-318681 | 11/2003 |
| JP | 2004-194105 | 7/2004 |
| JP | 2006-50145 A | 2/2006 |
| JP | 2006-054607 A | 2/2006 |
| JP | 2006-262003 | 9/2006 |
| JP | 2006-345481 A | 12/2006 |
| JP | 2007-243510 | 9/2007 |

OTHER PUBLICATIONS

English translation of Office Action received in Japanese App. No. 2008-074848.

* cited by examiner

*Primary Examiner* — Jessica Stultz
*Assistant Examiner* — Sean Hagan
(74) *Attorney, Agent, or Firm* — Miles & Stockbridge P.C.

(57) ABSTRACT

To solve problematic trade-off between a bandwidth and a in-band deviation in an optical signal receiving circuit of a gigabit order that is required to have a wide dynamic range, the optical signal receiving circuit has a current-voltage conversion circuit that receives as an input a current signal outputted from a photoelectric conversion circuit for receiving and converting an optical signal into a current signal and converts it into a voltage signal, and realizes the wide dynamic range by providing the current-voltage conversion circuit with an AGC function and a phase compensation function by MOS transistors and a capacitance. Further, by providing the current-voltage conversion circuit with a second phase compensation function by a MOS transistor and a capacitance, it is made possible for the optical signal receiving circuit to reduce the in-band deviation at the time of minimum gain while securing the bandwidth at the time of maximum gain.

6 Claims, 6 Drawing Sheets

OPTICAL SIGNAL RECEIVING CIRCUIT

CLAIM OF PRIORITY

The present application claims priority from Japanese patent application JP 2008-074848 filed on Mar. 24, 2008, the content of which is hereby incorporated by reference into this application.

FIELD OF THE INVENTION

This invention relates to an optical signal receiving circuit for converting an optical signal into a differential voltage signal and, more specifically, to an optical signal receiving circuit of a gigabit order in which a wide dynamic range is required.

BACKGROUND OF THE INVENTION

Conventionally, there was a technology of intending to reduce a noise added to a preamplifier output signal when a preamplifier input signal changes from a small level signal to a large level signal as a preamplifying circuit (for example, see JP-A-2001-320253).

In addition, conventionally, there was a technology of making a voltage standing wave ratio at input and output terminals excellent and intending to set an attenuation of gain arbitrarily regardless of existence of gain variability, as a gain controllable amplifier (for example, see JP-A-2004-194105).

Moreover, conventionally, there was a technology of performing AGC (Automatic Gain Control) of both a preamplifier and a postamplifier, as an optical receiving circuit (for example, see JP-A-2003-318681, JP-A-Hei11(1999)-266126, and JP-A-Hei2(1990)-278906).

Moreover, conventionally, there was a technology of performing AGC of a preamplifier by binary control and hysteresis control, as an optical receiving circuit (for example, see JP-A-2006-262003).

SUMMARY OF THE INVENTION

In recent years, the amount of communication is increasing rapidly by the spread of broadband Internet, and wider bandwidth of a giga bit order is sought for to optical signal receiving circuits. In addition, the optical signal receiving circuits used in long-distance transmission using an APD (avalanche photodiode), LRM (Long-Reach-Multimode) using multimode fiber, etc. are required to have wide dynamic ranges.

The inventors of the present application have examined technologies of realizing an optical signal receiving circuit that features the wide dynamic range, a wide bandwidth, and a small gain deviation in the band (in-band deviation) in advance of this application. The optical signal receiving circuit converts a current signal converted by a photoelectric conversion circuit into a differential voltage signal. In the case where the wide dynamic range is required, the optical signal receiving circuit is required to convert it linearly into the differential voltage signal without causing a distortion for small to large input current signals. When the input current signal is small, a current-voltage conversion circuit of the optical signal receiving circuit must increase the gain in order to output a sufficiently large differential voltage signal, and on the other hand when the input current signal is large, it must decrease the gain in order to prevent saturation of internal circuit elements. In order to solve this trade-off, an automatic gain control (AGC) function of automatically adjusting the gain depending on the magnitude of the input current signal is given to the current-voltage conversion circuit. Moreover, since a phase margin of a feedback loop of a built-in amplifier runs short when a gain of the current-voltage conversion circuit becomes small, a phase compensation function is given to the current-voltage conversion circuit.

An example of the current-voltage conversion circuit that is given the AGC function and the phase compensation function is shown in FIG. 1 of JP-A-2001-320253. This document discloses a preamplifying circuit for reducing a noise applied to a preamplifier output signal at the time when a preamplifier input signal changes from a small level signal to a large level signal. Altogether, it can be considered as a document that describes the optical signal receiving circuit operating in the wide dynamic range. Especially, FIG. 1 of this document shows an example where a first FET switch 5 is connected in parallel to a feedback resistor of the current-voltage conversion circuit, and further a second FET switch 6 and a phase compensation capacitor 7, being connected in series, are connected between an input and an output of an inverting amplifier of the current-voltage conversion circuit. With the first FET switch 5, saturation of the inner circuit element can be prevented by controlling the gain of the current-voltage conversion circuit depending on the magnitude of the input current signal (AGC function), and with the second FET switch 6 and the capacitance (the phase compensation capacitor 7), a phase margin of the feedback loop of the built-in amplifier that runs short when the gain of the current-voltage conversion circuit is lessened can be expanded (phase compensation function). With these functions, it becomes possible to make the circuit operate stably and expand its dynamic range. Since the circuit of FIG. 1 of this document can realize the same function even if the FET is changed to a MOS transistor, hereafter an explanation will be given replacing the FET with the MOS transistor.

However, the general phase compensation system using a MOS transistor and a capacitance requires an ON resistance value of the MOS transistor to be reduced in order to expand a gain margin at the time of minimum gain, as shown in FIG. 4, and for this purpose, it is necessary to enlarge the gate width of the MOS transistor. If the gate width of the MOS transistor becomes large, parasitic capacitance will also become large, and the 0 dB frequency at the time of maximum gain will fall, as shown in FIG. 4, because the 0 dB frequency at the time of maximum gain is determined by a time constant of an RC filter formed by a feedback resistor and a capacitance between the input and output of the inverting amplifier. That is, the gain margin at the time of minimum gain and the 0 dB frequency at the time of maximum gain are traded off against each other. A fall of the 0 dB frequency leads to a fall of the bandwidth under closed-loop operating conditions, and a fall of the gain margin causes an increase in the in-band deviation under closed-loop operating conditions. Therefore, the bandwidth at the time of maximum gain and the in-band deviation at the time of minimum gain are traded off against each other.

In the foregoing, the inventors of the present application have found independently that although the technologies examined prior to the present application can realize the wide dynamic range characteristic, it is difficult to satisfy both the wide bandwidth characteristic and the small in-band deviation characteristic simultaneously.

Incidentally, in the case of a configuration in which AGC is performed only for a postamplifier, generally a need of reducing transimpedance of the preamplifier will arise in order to suppress a waveform distortion in the output of the preamplifier. In connection with it, a possibility that a noise may increase becomes high.

Consequently, the inventors of the present application examined a configuration in which AGC is performed on both the preamplifier and the postamplifier that constitute the optical signal receiving circuit. As a result, the inventors of the present application found uniquely that there are the following problems among the prior arts disclosed in the above-mentioned JP-A-2003-318681, JP-A-Hei11(1999)-266126, JP-A-Hei2(1990)-278906, and JP-A-2006-262003.

JP-A-2003-318681 and JP-A-Hei2(1990)-278906 each disclose a configuration in which AGC is performed on both the preamplifier and the postamplifier; however, each of them do not disclose a configuration in which the preamplifier is controlled based on a direct current component of the input signal. Moreover, each of them does not disclose a configuration in which the preamplifier and the postamplifier are individually controlled.

JP-A-Hei11(1999)-266126 discloses a configuration in which AGC is performed on both the preamplifier and the postamplifier in order to keep an output amplitude constant, but does not disclose a configuration in which AGC is performed on both the preamplifier and the postamplifier in order to lessen a gain variable width of the preamplifier.

JP-A-2006-262003 discloses a configuration in which AGC of the preamplifier is performed by both binary control and hysteresis control; however, it does not disclose a configuration in which AGC using the binary control and the hysteresis control is performed on the preamplifier side in a configuration in which AGC is performed on both the preamplifier and the postamplifier. In addition, it does not disclose an object of performing the binary control.

Incidentally, although JP-A-2004-194105 discloses a problem that a voltage standing wave ratio at input and output terminals is made excellent and the amount of gain attenuation is arbitrarily set up regardless of the existence of gain variability, the configuration disclosed by this document is a configuration in which the FET 1 for signal amplification and the FET 4 for amplifier bypassing operate complementarily, and it does not disclose a configuration in which AGC is performed by the feedback loop for feeding back the output of the amplifier to the input. That is, it differs from the invention of this application based on a premise of AGC by the feedback loop.

It will be as follows if one example of typical means of the present invention is shown. That is, the optical signal receiving circuit of the present invention is formed by having: the current-voltage conversion circuit that receives as an input a current signal outputted from the photoelectric conversion circuit for receiving and converting an optical signal into a current signal and converts the current signal into a voltage signal; a voltage generation circuit for generating a direct current voltage of the voltage signal outputted from the current-voltage conversion circuit; a differential amplifying circuit that receives as inputs a first voltage signal outputted from the current-voltage conversion circuit and a second voltage signal outputted from the voltage generation circuit, amplifies a differential component of the first and second voltage signals, and outputs a differential voltage signal; an output driver circuit for driving a subsequent IC by receiving as an input the voltage signal outputted from the differential amplifying circuit; and a first feedback loop for controlling the gain of the current-voltage conversion circuit based on the first voltage signal; wherein the current-voltage conversion circuit is equipped with two sets of phase compensation circuits each consisting of a MOS transistor and a capacitance.

A typical effect of the invention by the above-mentioned configuration is that the optical signal receiving circuit featuring the wide dynamic range, the wide bandwidth, and the small in-band deviation can be realized.

BRIEF DESCRIPTION OF THE DRAWINGS

FIGS. 8A, 8B, 8C, 8D, and 8E show a mechanism of a distortion of an output voltage waveform of the current-voltage conversion circuit 10; in which:

FIG. 8A is an input current changing in time;

FIG. 8B is an output voltage of the current-voltage conversion circuit 10 with an assumption that an output resistance of a MOS transistor is constant;

FIG. 8C is a gate-source voltage of the MOS transistor;

FIG. 8D is an output resistance of the MOS transistor changing in time; and

FIG. 8E is an output voltage with the changing output resistance.

DETAILED DESCRIPTION OF THE PREFERRED EMBODIMENTS

Figure 1A:
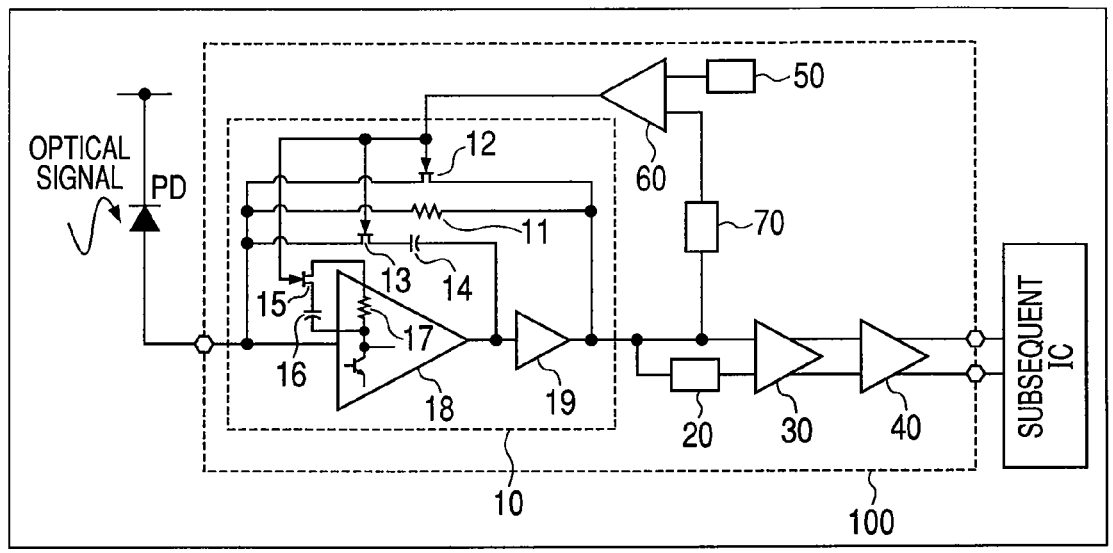
FIG. 1A is a configuration diagram of an optical signal receiving circuit 100 to which the present invention is applied.

The optical signal receiving circuit of the present invention is configured by having: a current-voltage conversion circuit that receives an output current signal from a photoelectric conversion circuit for receiving and converting an optical signal into a current signal and converts it into a voltage signal; a voltage generation circuit for generating a direct current voltage from the output signal; a differential amplifying circuit for outputting a differential voltage signal; and an output driver circuit for driving a subsequent IC.

A first MOS transistor is connected to the current-voltage conversion circuit in parallel to the feedback resistor, and a second MOS transistor and a first capacitance are connected between the input and output of an inverting amplifier. Further, a third MOS transistor and a second capacitance are connected in parallel to a load resistor of the inverting amplifier. A gate voltage of the first MOS transistor is adjusted by the first AGC circuit so that a direct current component of the output voltage signal of the current-voltage conversion circuit may be constant. It is suitable that the gates of the first, second, and third MOS transistors are made common.

It is suitable if the current-voltage conversion circuit is further equipped with an amplifying circuit made up of series connection of the inverting amplifier and a buffer circuit, a feedback resistor connected between an input and an output of the amplifying circuit, and a first MOS transistor connected in parallel to the feedback resistor.

It is suitable if the first phase compensation circuit that is one of the two sets of the phase compensation circuits is formed to consist of a second MOS transistor and a first capacitance that are connected between the input and output of the inverting amplifier.

Moreover, it is suitable if the second phase compensation circuit that is the other of the two sets of phase compensation circuits is formed to consist of a third MOS transistor and a second capacitance that are connected in parallel to the load resistor of the inverting amplifier.

It is suitable to configure the optical signal receiving circuit so that a direct current voltage signal according to an average level of an input current signal may be commonly applied to the respective gates of the second and third MOS transistors.

Moreover, it is suitable if the direct current voltage signal being commonly applied to the gates of the second and third MOS transistors is made to be commonly applied to the gate of the first MOS transistor.

Furthermore, the optical signal receiving circuit of the present invention may be configured by further having a second AGC circuit for controlling the gain of the differential amplifying circuit from an output of the output driver circuit.

It is suitable if the optical signal receiving circuit is formed to have a configuration in which the gate voltage of the first MOS transistor and the gate voltage of the second MOS transistor are binary-controlled and its switch threshold is made to have a hysteresis.

Furthermore, it is suitable if the optical signal receiving circuit is formed to have a configuration in which the gate voltage of the third MOS transistor is binary-controlled and its switch threshold is made to have a hysteresis.

Grasping the present invention from a different point of view, the optical signal receiving circuit is considered an optical signal receiving circuit having two functions: a first AGC function of controlling the amplitude of the first voltage signal depending on a direct current component of the current signal; and a two-step phase compensation function of performing phase compensation in two steps depending on the direct current component of the current signal.

It is suitable if the current-voltage conversion circuit is further equipped with an amplifying circuit made up of series connection of an inverting amplifier and a buffer circuit, a feedback resistor connected between the input and output of the amplifying circuit, and a first MOS transistor connected in parallel to the feedback resistor.

Moreover, it is suitable if the first AGC function is realized by changing the gate voltage of the first MOS transistor.

It is suitable if the two-step phase compensation function includes a first phase compensation function of performing phase compensation of a feedback loop configured in the inside of the current-voltage conversion circuit depending on a direct current component of the current signal and a second phase compensation function of further performing phase compensation on the signal that is phase-compensated by this first phase compensation function.

It is suitable if the current-voltage conversion circuit is further equipped with a second MOS transistor and a first capacitance that are connected between the input and output of the inverting amplifier. In that case, the first phase compensation function is realized by changing the gate voltage of the second MOS transistor depending on a direct current component of the current signal.

Moreover, it is suitable if the current-voltage conversion circuit is further equipped with a third MOS transistor and a second capacitance that are connected in parallel to the load resistor of the inverting amplifier. In that case, the second phase compensation function is realized by changing the gate voltage of the third MOS transistor depending on a direct current component of the current signal.

On the other hand, it is suitable if the differential amplifying circuit has a second AGC function of keeping the output amplitude of the output driver circuit constant.

Moreover, it is suitable if the optical signal receiving circuit is formed to have a configuration in which binary control of controlling the first AGC function and the first phase compensation function by binary is performed and a switch threshold of the binary control is made to have a hysteresis.

It is suitable if the optical signal receiving circuit is formed to have a configuration in which binary control of controlling the second phase compensation function by binary is performed and a switch threshold of the binary control is made to have a hysteresis.

Hereafter, embodiments of the present invention will be described in detail using the drawings. Circuit elements constituting each block are not particularly restricted; however, they are formed on one sheet of semiconductor substrate like single crystal silicon by a publicly known integrated circuit technology. Moreover, the embodiment shows the circuit that uses the bipolar transistor and the MOS transistor; however, the invention of the present application is not necessarily limited to this, but is applied to circuits that use common semiconductors. Moreover, each element shown in the figure may realize required characteristics by parallel or series connection of the same elements.

First Embodiment

Figure 1B:
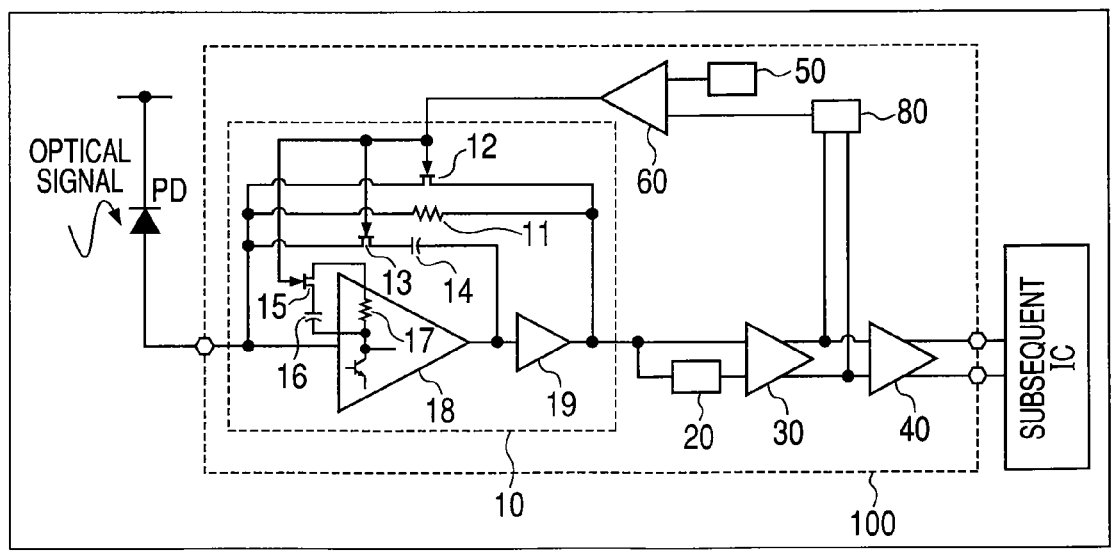
FIG. 1B is another configuration diagram of the optical signal receiving circuit 100 to which the present invention is applied.
Figure 1C:
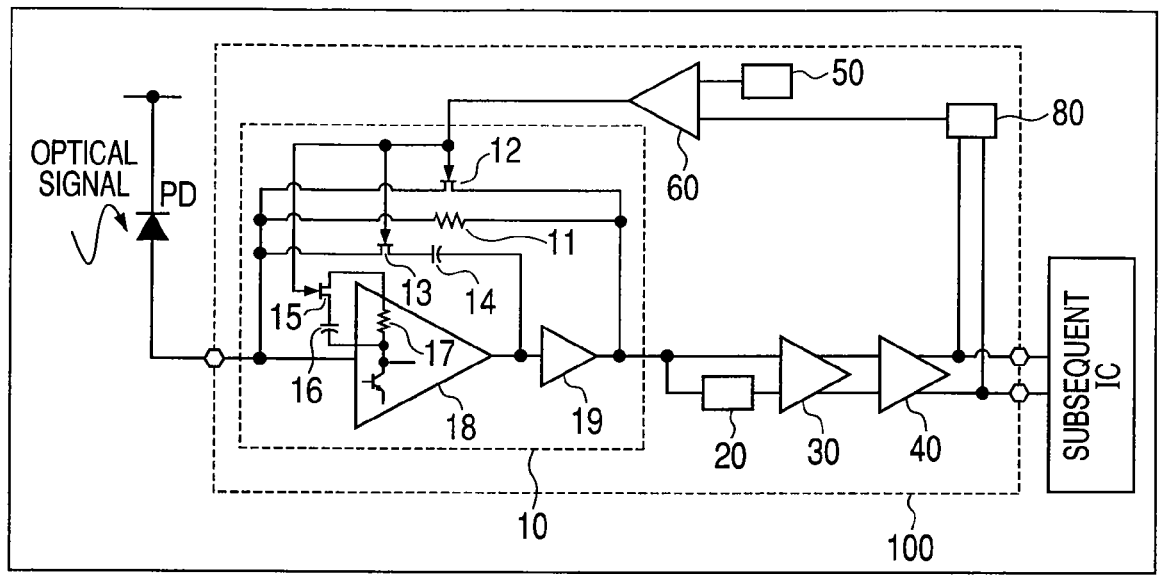
FIG. 1C is further another configuration diagram of the optical signal receiving circuit 100 to which the present invention is applied.
Figure 1D:
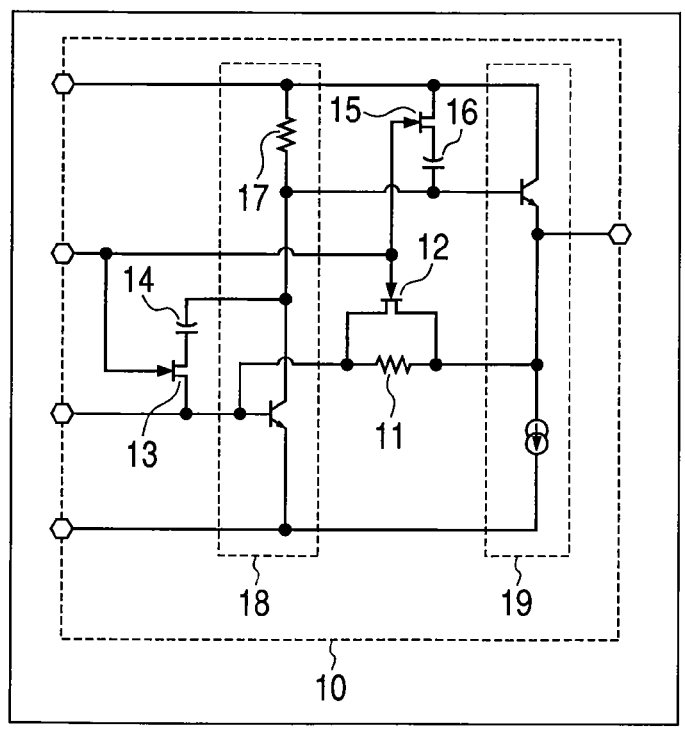
FIG. 1D is a circuit diagram showing one example of a current-voltage conversion circuit 10 of FIG. 1A, FIG. 1B, and FIG. 1C.

FIG. 1A and FIG. 1D show a first embodiment of an optical signal receiving circuit to which the present invention is applied. FIG. 1A shows a configuration of an optical signal receiving circuit 100 of this embodiment and a configuration of it connected to the photoelectric conversion circuit PD (photodiode), and FIG. 1D shows a circuit configuration example of a current-voltage conversion circuit 10, respectively. The optical signal receiving circuit 100 of this embodiment is formed by having: the current-voltage conversion circuit 10 that receives as an input a current signal outputted from the photoelectric conversion circuit PD (photodiode) for receiving and converting the optical signal into a current signal and converts the current signal into a voltage signal; a reference voltage generation circuit 20 for generating a direct current voltage of the voltage signal outputted from the current-voltage conversion circuit 10; a differential amplifying circuit 30 for outputting the differential voltage signal by amplifying a difference between the voltage signal outputted from the current-voltage conversion circuit 10 and that outputted from the reference voltage generation circuit 20; and an output driver circuit 40 for driving the subsequent IC. The current-voltage conversion circuit 10 is formed by having: an amplifying circuit made up of series connection of an inverting amplifier 18 and a buffer circuit 19; a feedback resistor 11 connected between the input and output of the amplifying circuit; a MOS transistor 12 connected in parallel to the feedback resistor 11; a MOS transistor 13 and a capacitance 14 connected between the input and output of the inverting amplifier 18; and a MOS transistor 15 and a capacitance 16 connected in parallel to a load resistor 17 of the inverting amplifier 18. A low pass filter 70 generates a direct current voltage of the output voltage of the current-voltage conversion circuit 10. The gate voltage of the MOS transistor 12 is controlled by an AGC circuit 60 that receives as inputs the output voltage of the low pass filter 70 and an output voltage of a reference voltage generation circuit 50. The input of the AGC circuit 60 may be an output voltage of a peak detection circuit 80 that receives as an input the output voltage of the differential amplifying circuit 30, as shown in FIG. 1B, or may be an output voltage of the peak detection circuit 80 that receives as an input the output voltage of the output driver circuit 40, as shown in FIG. 1C. By making gates of the MOS transistor 12, the MOS transistor 13, and the MOS transistor 15 common, a common gate voltage is supplied to them from the AGC circuit 60. This configuration performs the first phase compensation with the MOS transistor 13 and the capacitance 14 and performs the second phase compensation with the MOS transistor 15 and the capacitance 16, and is characterized in that the phase compensation is done in two steps. The optical signal receiving circuit differs in this point from FIG. 1 of JP-A-2001-320253 that performs the phase compensation in a single step.

Operations of the first embodiment will be explained.

The optical signal receiving circuit 100 converts the current signal outputted from the PD into a voltage signal with the current-voltage conversion circuit 10. The voltage signal is inputted into the reference voltage generation circuit 20, which generates a direct current voltage of the inputted voltage signal. The output voltage signal of the current-voltage conversion circuit 10 and the output voltage signal of the reference voltage generation circuit 20 are inputted into the differential amplifying circuit 30, which generates the differential voltage signal. The differential voltage signal is inputted into the output driver circuit 40, which drives the subsequent IC.

As the input current signal increases, the output voltage of the low pass filter 70 that receives as an input the output voltage of the current-voltage conversion circuit 10 decreases, and when it goes below the output voltage of the reference voltage generation circuit 50, the AGC circuit 60 increases the gate voltage of the MOS transistor 12 until the output voltage of the low pass filter 70 becomes equal to the output voltage of the reference voltage generation circuit 50, and thereby decreases a gain of the current-voltage conversion circuit 10. From this, the optical signal receiving circuit 100 realizes the first AGC function that adjusts the gain of the current-voltage conversion circuit 10 depending on the magnitude of the input current signal. Since AGC control is performed from the direct current voltage of the output signal voltage of the current-voltage conversion circuit 10, a peak detector becomes unnecessary and chip area and power consumption can be reduced. Moreover, it becomes possible to easily carry out an internal test of the gain switch function that may become complicated when a peak detector is used. The AGC circuit 60 further supplies the MOS transistor 13 with a gate voltage common to that of the MOS transistor 12. When the input current signal increases, consequently the gate voltage of the MOS transistor 12 increases, and the gain of the current-voltage conversion circuit 10 becomes small; the phase margin of a feedback loop of a built-in amplifier runs short. However, since the gate voltage of the MOS transistor 13 increases, the impedance between the input and output of the inverting amplifier 18 decreases, and it becomes possible to expand the phase margin. With this capability, the optical signal receiving circuit 100 realizes the first phase compensation function.

Figure 5:
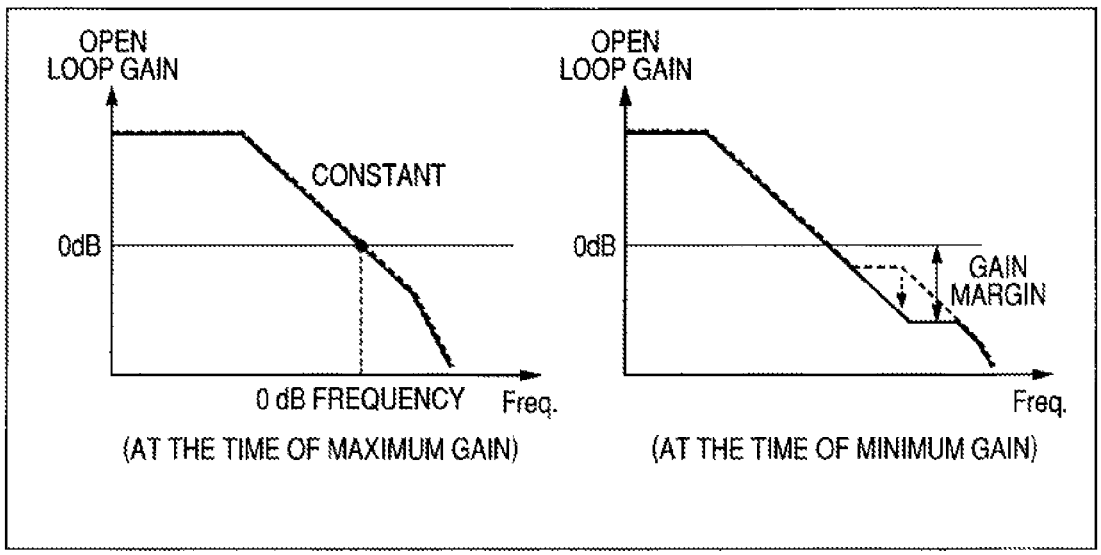
FIG. 5 is an open loop characteristic of the current-voltage conversion circuit 10 of FIG. 1A.

The AGC circuit 60 further supplies the MOS transistor 15 with the gate voltage common to that of the MOS transistor 12. When the input current signal increases, the gate voltage of the MOS transistor 12 increases, and the gain of the current-voltage conversion circuit 10 becomes small; the gate voltage of the MOS transistor 15 also increases. The gain of the feedback loop of the built-in amplifier is determined by the gain of the inverting amplifier 18. It becomes possible to decrease the gain of the feedback loop of the built-in amplifier only in a high frequency domain by the MOS transistor 15 and the capacitance 16 connected in parallel to the load resistor 17 of the inverting amplifier 18 when the gain of the current-voltage conversion circuit 10 becomes small, which consequently makes it possible to expand a gain margin at the time of minimum gain, as shown in FIG. 5. With this capability, the optical signal receiving circuit 100 realizes the second phase compensation function. Incidentally, the bipolar transistor of the inverting amplifier 18 is provided with a collector current that is determined by a voltage applied across the load resistor 17, and is always turned ON. Since the 0 dB frequency at the time of maximum gain is determined by a time constant of an RC filter formed by the feedback resistor 11 and a capacitance between the input and output of the inverting amplifier 18, parasitic capacitance of the MOS transistor 15 does not contribute to the 0 dB frequency. Therefore, it becomes possible to expand the gain margin at the time of minimum gain while securing the 0 dB frequency at the time of maximum gain, as shown in FIG. 5. Therefore, it becomes possible to reduce an in-band deviation at the time of minimum gain while securing the bandwidth at the time of maximum gain, and consequently trade-off of the two characteristics that becomes a problem when phase compensation is performed in a single step can be solved.

Second Embodiment

Figure 2:
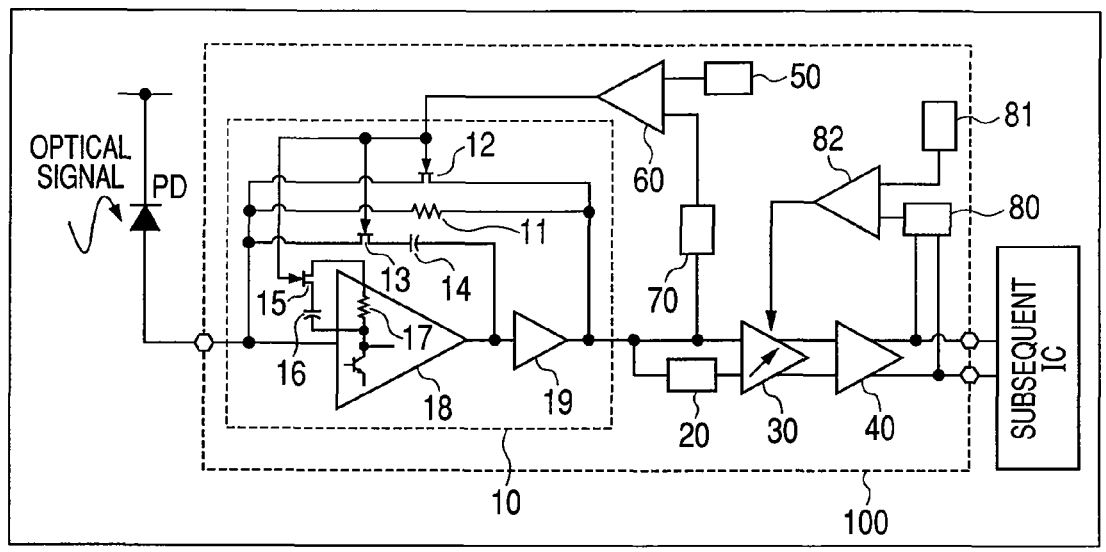
FIG. 2 is a configuration diagram of the optical signal receiving circuit 100 to which the present invention is applied.

FIG. 2 shows a second embodiment of an optical signal receiving circuit to which the present invention is applied. A difference of the second embodiment from the first embodiment is that the differential amplifying circuit 30 is provided with the second AGC function by virtue of the peak detection circuit 80, a reference voltage generation circuit 81, and an AGC circuit 82. The output voltage signal of the differential amplifying circuit 30 is inputted into the peak detector 80 via the output driver circuit 40, the peak detector 80 generates a direct current voltage according to an amplitude of the input voltage signal, and the direct current voltage is inputted into the AGC circuit 82 together with the output voltage of the reference voltage generation circuit 81. The AGC circuit 82 adjusts the gain of the differential amplifying circuit 30 so that the output voltage of the peak detector 80 may become equal to the output voltage of the reference voltage generation circuit 81. From this operation, the optical signal receiving circuit 100 realizes the second AGC function.

In the case where a dynamic range is further expanded in the first embodiment, a gain variable width of the current-voltage conversion circuit 10 is required to be expanded. Consequently, it is necessary to further enlarge the gate widths of the MOS transistors 12, 13, and 15 in order that ON resistance values of the MOS transistors 12, 13, and 15 can be reduced. However, since the enlargement of the gate widths increases the parasitic capacitance, the bandwidth deteriorates by an increased portion of the parasitic capacitance of the MOS transistors 12, 13. The increased portion of the parasitic capacitance of the MOS transistor 15 causes a distortion in an output voltage waveform of the current-voltage conversion circuit 10.

In order to solve this, the subsequent differential amplifying circuit 30 is equipped with the second AGC function, and thereby two-step AGC control is performed by the current-voltage conversion circuit 10 and the differential amplifying circuit 30, which enables the current-voltage conversion circuit 10 and the differential amplifying circuit 30 to divide the gain variable width into two portions. Since this scheme makes it possible to lessen the gain variable width of the current-voltage conversion circuit 10, to lessen the gate widths of the MOS transistors 12, 13, and 15, and to reduce the parasitic capacitance, it become possible to expand the dynamic range while securing the bandwidth and suppressing the distortion of the output waveform. The AGC control of the current-voltage conversion circuit 10 and that of the differential amplifying circuit 30 are performed by respective loops, so that the each feedback loop may be prevented from doing an unstable operation.

Third Embodiment

Figure 3:
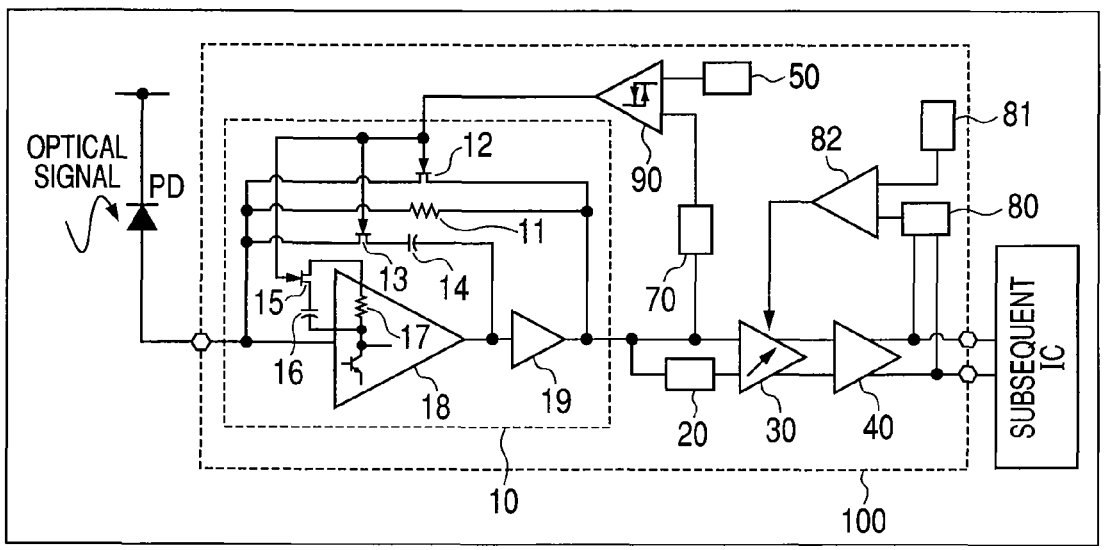
FIG. 3 is a configuration diagram of the optical signal receiving circuit 100 to which the present invention is applied.
Figure 4:
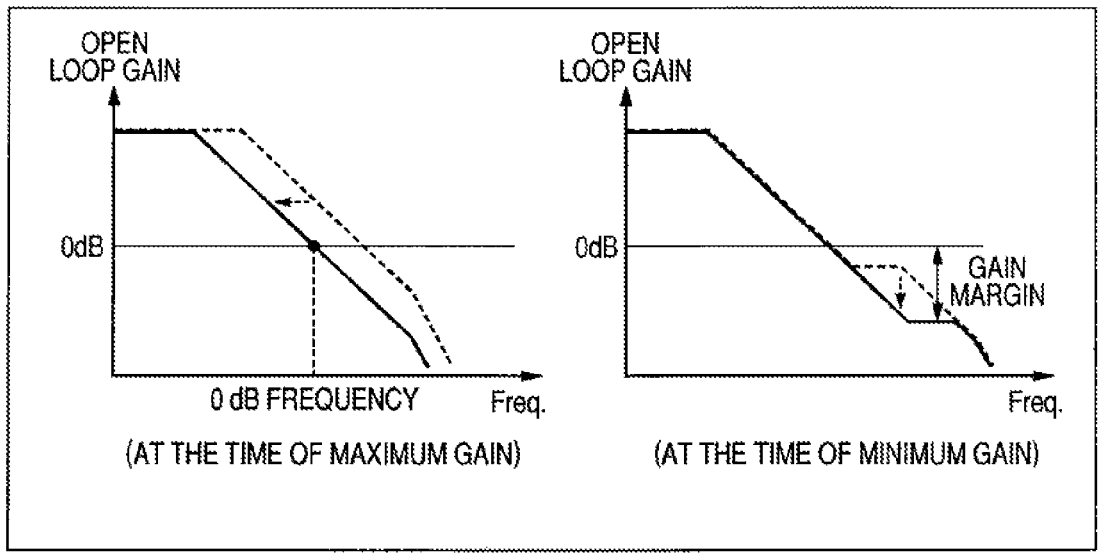
FIG. 4 is an open loop characteristic of a current-voltage conversion circuit of FIG. 1 of JP-A-2001-320253.
Figure 6:
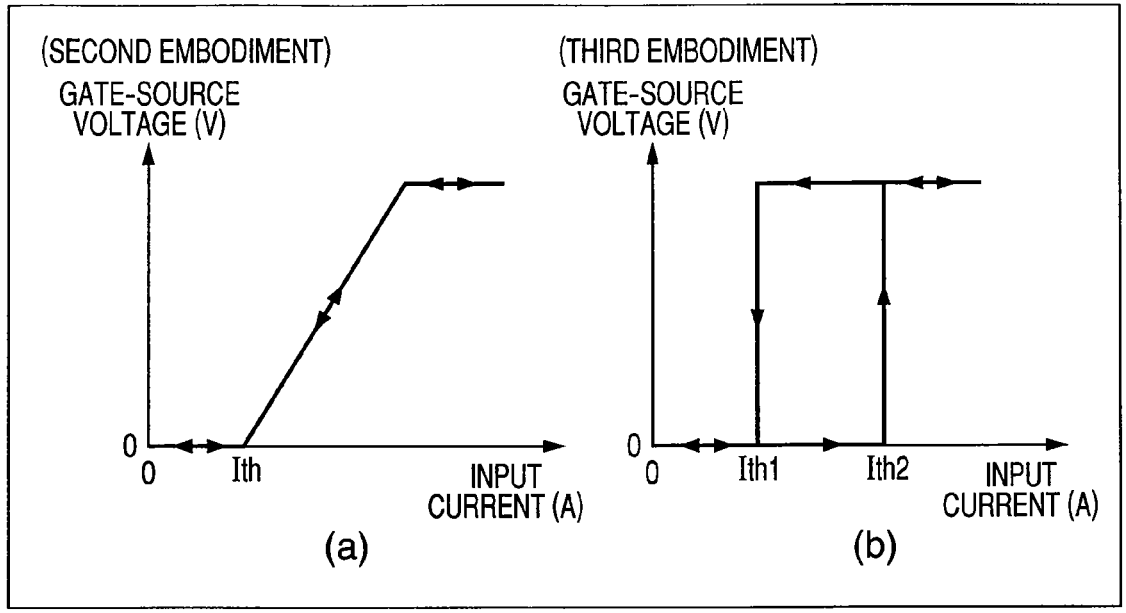
FIG. 6A is a relation diagram between an input current and a gate-source voltage of a MOS transistor 12 with control by an AGC circuit 60.
FIG. 6B is a relation diagram between an input current and a gate-source voltage of the MOS transistor 12 with control by a comparator 90.
Figure 7:
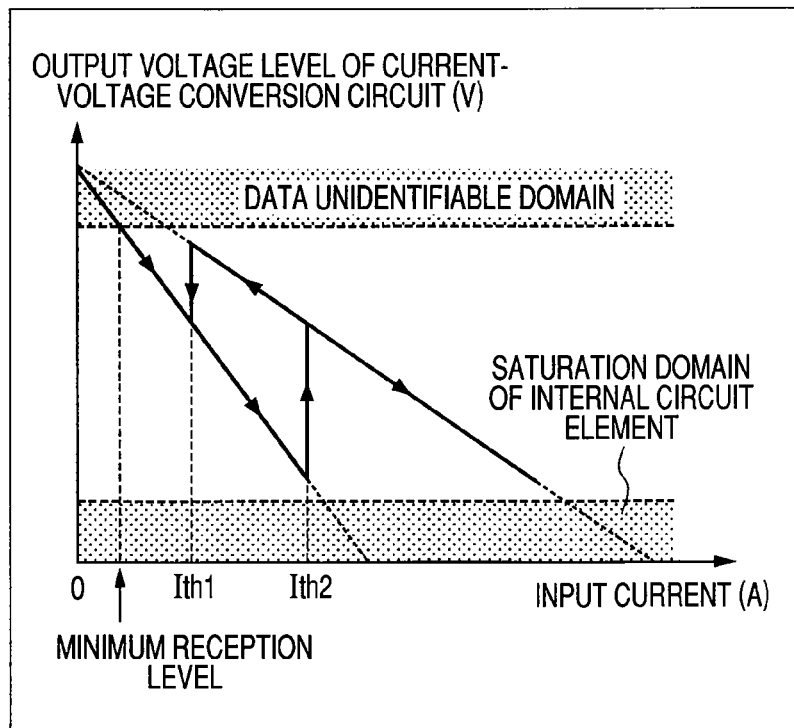
FIG. 7 is a method for setting switch thresholds Ith1 and Ith2.

FIG. 3 shows a third Embodiment of an optical signal receiving circuit to which the present invention is applied. The third embodiment differs from the second embodiment in that the AGC circuit 60 is replaced with a comparator 90 with a hysteresis function. The AGC circuit 60 in the second embodiment controls a gate-source voltage of the MOS transistor 12 as shown in FIG. 6A with change of an input current. In a domain of the input current >Ith, an increase of the input current will increase continuously the gate-source voltage of the MOS transistor 12. The gate-source voltage of the MOS transistor 12 increases to a limit that is determined by the maximum output level of the AGC circuit 60, and after this, even if the input current increases, it will remain constant. On the other hand, the comparator 90 in this third embodiment controls the gate-source voltage of the MOS transistor 12 with change of the input current as shown in FIG. 6B. When the input current comes to be >Ith1, the gate-source voltage of the MOS transistor 12 changes at a stretch from 0 V to a value determined by the maximum output level of the comparator 90. Moreover, when the input current comes to be <Ith2, the gate-source voltage of the MOS transistor 12 changes at a stretch to 0 V. Therefore, the gate-source voltage of the MOS transistor 12 is binary-controlled. In order to avoid an event that the switching operation of the gate-source voltage of the MOS transistor 12 does an unstable operation, the switch thresholds are specified to satisfy Ith1≠Ith2, and the switch thresholds are given a hysteresis function. As shown in FIG. 7, Ith1 is set up so that the output voltage level of the current-voltage conversion circuit may not go into a data unidentifiable domain; Ith2 is set up so that the output voltage level of the current-voltage conversion circuit may not go into a saturation domain of the internal circuit element.

Figure 8:
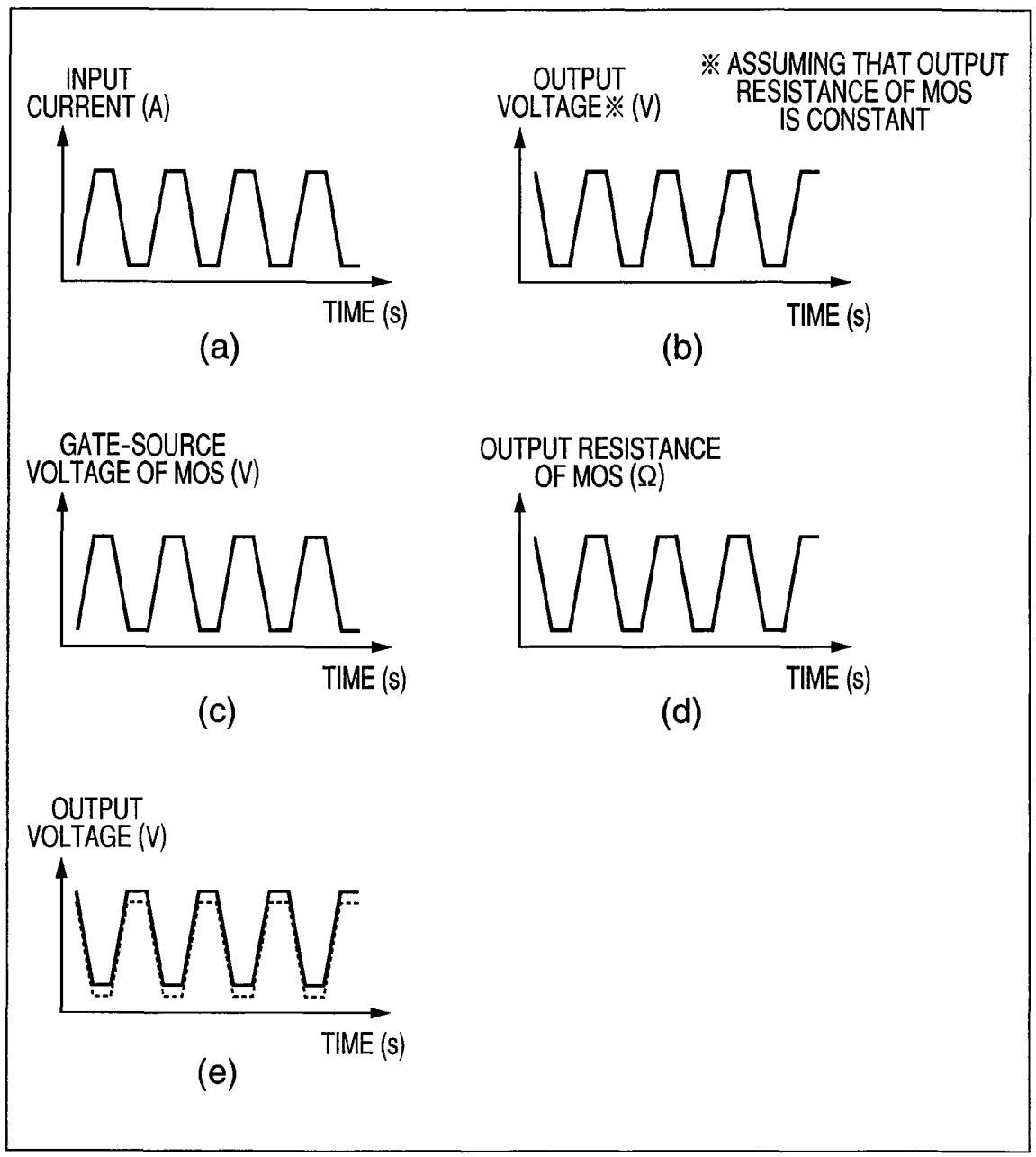

In the second embodiment, since the gain of the current-voltage conversion circuit 10 changes in time in connection with a temporal change of the input current, the distortion is caused in the output voltage waveform of the current-voltage conversion circuit 10. FIGS. 8A TO 8E illustrate the principle by which the distortion is caused. When the input current changes in time (FIG. 8A), the output voltage of the current-voltage conversion circuit 10, i.e., a source level of the MOS transistor 12, changes in time. Here, it is assumed that an output resistance value of the MOS transistor 12 is constant (FIG. 8B). Since a gate level of the MOS transistor 12 is constant, the gate-source voltage of the MOS transistor 12 will change in time (FIG. 8C), namely, the output resistance value of the MOS transistor 12 will change in time (FIG. 8D). This causes the distortion in the output voltage waveform of the current-voltage conversion circuit 10 (FIG. 8E).

A relation between a variation ΔVgs of the gate-source voltage of the MOS transistor and a variation Δr0 of the output resistance value of the MOS transistor is expressed by formula (3) from formulae (1) and (2).

$$Id=(k'/2)\cdot(W/L)\cdot(Vgs-Vt)^2\cdot(1+\lambda Vds) \quad (1)$$

$$r0=(\partial Id/\partial Vds)^{-1}=(\lambda Id)^{-1} \quad (2)$$

$$\Delta r0/\Delta Vgs=\partial r0/\partial Vgs=-K/(Vgs-Vt)^3 \quad (3)$$

where $K=\{(\lambda/2)\cdot(k'/2)\cdot(W/L)\cdot(1+\lambda Vds)\}^{-1}$

Formula (3) shows that a variation of the output resistance value of the MOS transistor by a variation of the gate-source voltage of the MOS transistor becomes remarkable when an average value of the gate-source voltage is small, and conversely becomes indistinctive when the average value of the gate-source voltage is large.

In the third embodiment, the gate-source voltage of the MOS transistor 12 is binary-controlled, and the gate-source voltage is 0 V or a value determined by the maximum output level of the comparator 90. When the gate-source voltage is 0 V, since the MOS transistor 12 is turned OFF, the output resistance remains infinite. When the gate-source voltage is the value determined by the maximum output level of the comparator 90, since Vgs−Vt>>0 V stands, the variation of the output resistance of the MOS transistor 12 becomes extremely small. Therefore, even if the input current changes in time, the distortion is not caused in the output voltage waveform of the current-voltage conversion circuit 10. Moreover, since the gain of the current-voltage conversion circuit 10 is binary-controlled, if the differential amplifying circuit 30 is not provided with the second AGC function, an IC output amplitude cannot be controlled constant when the magnitude of the input current signal varies. This problem is solved by making the differential amplifying circuit 30 have the second AGC function like this third embodiment.

What is claimed is:

1. An optical signal receiving circuit, comprising:
   a current-voltage conversion circuit that receives as an input a current signal outputted from a photoelectric conversion circuit for receiving and converting an optical signal into a current signal and converts the current signal into a voltage signal;
   a voltage generation circuit for generating a direct current voltage of the voltage signal outputted from the current-voltage conversion circuit;
   a differential amplifying circuit that receives as inputs a first voltage signal outputted from the current-voltage conversion circuit and a second voltage signal outputted from the voltage generation circuit and outputs a differential voltage signal by amplifying a differential component of the first and second voltage signals;
   an output driver circuit for driving a subsequent IC by receiving as an input the voltage signal outputted from the differential amplifying circuit; and
   a first feedback loop for controlling a gain of the current-voltage conversion circuit based on the first voltage signal,
   wherein the current-voltage conversion circuit is equipped with two sets of phase compensation circuit each consisting of a MOS transistor and a capacitance,
   wherein the current-voltage conversion circuit further includes
      an amplifying circuit made up of series connection of an inverting amplifier and a buffer circuit;
      a feedback resistor connected between an input and an output of the amplifying circuit; and
      a first MOS transistor connected in parallel to the feedback resistor,
      wherein a first phase compensation circuit that is one of the two sets of phase compensation circuits includes a second MOS transistor and a first capacitance that are connected between the input and output of the inverting amplifier,
   wherein a second phase compensation circuits that is the other of the two sets of phase compensation circuits includes a third MOS transistor and a second capacitance that are connected in parallel to a load resistor of the inverting amplifier, and
   wherein a direct current voltage signal according to an average level of an input current signal is applied in common on respective gates of the second and third MOS transistors.

2. The optical signal receiving circuit according to claim 1, wherein the direct current voltage signal that is applied in common on respective gates of the second and third MOS transistors is applied in common on a gate of the first MOS transistor.

3. The optical signal receiving circuit according to claim 2, wherein binary control of controlling a gate voltage of the first MOS transistor, a gate voltage of the second MOS transistor, and a gate voltage of the third MOS transistor by binary is performed and a switch threshold of the binary control is made to have a hysteresis.

4. An optical signal receiving circuit, comprising:
   a current-voltage conversion circuit that receives as an input a current signal outputted from a photoelectric conversion circuit for receiving and converting an optical signal into a current signal and converts the current signal into a voltage signal;

a voltage generation circuit for generating a direct current voltage of the voltage signal outputted from the current-voltage conversion circuit;

a differential amplifying circuit that receives as inputs a first voltage signal outputted from the current-voltage conversion circuit and a second voltage signal outputted from the voltage generation circuit and outputs a differential voltage signal by amplifying a differential component of the first and second voltage signals; and an output driver circuit that receives as an input the voltage signal outputted from the differential amplifying circuit and drives a subsequent IC, wherein the current-voltage conversion circuit includes
a first AGC function of controlling an amplitude of the first voltage signal depending on a direct current component of the current signal; and
a two-step phase compensation function of performing phase compensation in two steps depending on the direct current component of the current signal, wherein the two-step phase compensation function includes
a first phase compensation function of performing phase compensation of a feedback loop configured in an inside of the current-voltage conversion circuit depending on the directed current component of the current signal; and
a second phase compensation function of further performing phase compensation on a signal that is phase-compensated by the first phase compensation function, wherein the current-voltage conversion circuit further includes
an amplifying circuit made up of series connection of an inverting amplifier and a buffer circuit;
a feedback resistor connected between and input and an output of the amplifying circuit;
a first MOS transistor connected in parallel to the feedback resistor; and
a second MOS transistor and a first capacitance that are connected between an input and an output of the inverting amplifier,
wherein the first phase compensation function is realized by changing a gate voltage of the second MOS transistor depending on the direct current component of the current signal, and wherein the current-voltage conversion circuit further includes
a third MOS transistor and a second capacitance that are connected in parallel to a load resistor of the inverting amplifier, and
wherein the second phase compensation function is realized by changing a gate voltage of the third MOS transistor depending on the direct current component of the current signal.

5. An optical signal receiving circuit,comprising:
a current-voltage conversion circuit that receives as an input a current signal outputted from a photoelectric conversion circuit for receiving and converting an optical signal into a current signal and converts the current signal into a voltage signal;

a voltage generation circuit for generating a direct current voltage of the voltage signal outputted from the current-voltage conversion circuit;

a differential amplifying circuit that receives as input a first voltage signal outputted from the current-voltage conversion circuit and a second voltage signal outputted from the voltage generation circuit and outputs a differential voltage signal by amplifying a differential component of the first and second voltage signal; and an output driver circuit that receives as an input the voltage signal outputted from the differential amplifying circuit and drives a subsequent IC, wherein the current-voltage conversion circuit includes
a first AGC function of controlling an amplitude of the first voltage signal depending on a direct current component of the current signal; and
a two-step phase compensation function of performing phase compensation in two steps depending on the direct current component of the current signal, wherein the two-step phase compensation function includes
a first phase compensation function of performing phase compensation of a feedback loop configured in an inside of the current-voltage conversion circuit depending on the direct current component of the current signal; and
a second phase compensation function of further performing phase compensation on a signal that is phase-compensated by the first phase compensation function, and wherein the current-voltage conversion circuit further includes an amplifying circuit made up of series connection of an inverting amplifier and a buffer circuit, a feedback resistor connected between an input and an output of the amplifying circuit, a first MOS transistor connected in parallel to the feedback resistor, and a third MOS transistor and a second capacitance that are connected in parallel to a load resistor of the inverting amplifier, and
wherein the second phase compensation function is realized by changing a gate voltage of the third MOS transistor depending on the direct current component of the current signal.

6. The optical signal receiving circuit according to claim 5, wherein binary control of controlling the first AGC function, the first phase compensation function, and the second phase compensation function by binary is performed and a switch threshold of the binary control is made to have a hysteresis.

* * * * *